US007671661B2

(12) United States Patent
Jung et al.

(10) Patent No.: US 7,671,661 B2
(45) Date of Patent: Mar. 2, 2010

(54) INTEGRATED CIRCUIT AND METHOD FOR AUTOMATICALLY TUNING PROCESS AND TEMPERATURE VARIATIONS

(75) Inventors: Sung-jae Jung, Seoul (KR); Sang-yoon Jeon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 10 days.

(21) Appl. No.: 11/437,649

(22) Filed: May 22, 2006

(65) Prior Publication Data

US 2007/0090870 A1 Apr. 26, 2007

(30) Foreign Application Priority Data

Oct. 21, 2005 (KR) ...................... 10-2005-0099899

(51) Int. Cl.
*H03K 5/153* (2006.01)
*H03K 3/011* (2006.01)

(52) U.S. Cl. ........................................ 327/512; 327/77

(58) Field of Classification Search ................. 327/512, 327/530, 513, 77–80; 323/313, 314; 716/1–5
See application file for complete search history.

(56) References Cited

U.S. PATENT DOCUMENTS 5,281,906 A * 1/1994 Thelen, Jr. .................. 323/313

| | | | |
|---|---|---|---|
| 6,728,940 B2 * | 4/2004 | Carelli et al. | 716/5 |
| 6,862,714 B2 * | 3/2005 | Jin et al. | 716/1 |
| 7,196,567 B2 * | 3/2007 | Nguyen | 327/308 |
| 2007/0236281 A1 * | 10/2007 | Cicalini | 327/553 |

FOREIGN PATENT DOCUMENTS

| JP | 05-315546 A | 11/1993 |
|---|---|---|
| JP | 08-274581 A | 10/1996 |

* cited by examiner

*Primary Examiner*—Lincoln Donovan
*Assistant Examiner*—Colleen O'Toole
(74) *Attorney, Agent, or Firm*—Sughrue Mion, PLLC

(57) ABSTRACT

Provided are an IC and a method for automatically tuning process and temperature variations. The IC includes: a test circuit unit including test circuit elements having identical element values and variations to a tuning-targeted circuit element and at least one reference circuit element having a smaller variation than the tuning-targeted circuit element; a comparator that obtains a difference between intensities of first and second signals detected from the test circuit unit; and a tuning unit that tunes the variation of the tuning-targeted circuit element according to the difference between the intensities of the first and second signals. Thus, process and temperature variations of a circuit element can be detected and accurately tuned with respect to the circuit element itself. Also, the process and temperature variations can be tuned inside an IC. Thus, the time required for tuning the process and temperature variations can be reduced.

7 Claims, 5 Drawing Sheets

INTEGRATED CIRCUIT AND METHOD FOR AUTOMATICALLY TUNING PROCESS AND TEMPERATURE VARIATIONS

CROSS-REFERENCE TO RELATED APPLICATIONS

This application claims the benefit of Korean Patent Application No. 10-2005-0099899 filed on Oct. 21, 2005, in the Korean Intellectual Property Office, the disclosure of which is incorporated herein by reference.

BACKGROUND OF THE INVENTION

1. Field of the Invention

The present invention relates to an integrated circuit (IC) and a method for automatically tuning process and temperature variations.

2. Description of the Related Art

In general, a process variation occurring in the manufacture of an IC must be tuned to accurately operate the IC. A conventional method of tuning a process variation will be described in brief with reference to FIG. 1.

FIG. 1 is a circuit diagram illustrating a conventional method of tuning a process variation. A case where circuit elements of which process variations are to be tuned for low pass filters (LPFs) 12 will be described with reference to FIG. 1. To tune the process variations of the LPFs 12 in a conventional IC 10, a test signal is input to an input node 11 when power is applied to the conventional IC 10 to perform an initialization, passes through the LPFs 12, and is output to a final rode 13. The test signal is transmitted to a process variation tuning circuit (not shown) installed outside through a modem (not shown). A tuning control signal is input from a tuning circuit installed outside to an input node 14 so as to tune the process variations of the LPFs 12. The above-described conventional method is achieved using a signal output from the final node 13 of the conventional IC 10. Thus, process variations occurring in circuit elements constituting the LPFs 12 are not directly considered.

The signal output from the final node 13 is transmitted to the tuning circuit installed outside, and a control signal is received from an external source with respect to a process variation. Thus, a relatively long time is required for tuning a process variation in the conventional method.

In addition, a modem or the like must be installed to communicate with an external tuning circuit. Thus, an IC has a complicated structure.

Only when the power is applied to the IC to perform the initialization, the tuning circuit operates to tune the process variation. Thus, temperature variations of the circuit elements occurring due to heat during the operation of the IC cannot be considered.

SUMMARY OF THE INVENTION

An apparatus and method consistent with the present invention relate to an IC (integrated circuit) and a method of automatically tuning process and temperature variations therein. Illustrative, non-limiting exemplary embodiments of the present invention overcome the above disadvantages and other disadvantages not described above. Also, the present invention is not required to overcome the disadvantages described above, and an illustrative, non-limiting exemplary embodiment of the present invention may not overcome any of the problems described above.

According to an aspect of the present invention, there is provided an IC comprising a plurality of circuit elements, including: a test circuit unit including a plurality of test circuit elements having identical element values and variations to a tuning-targeted circuit element of the plurality of circuit elements and at least one reference circuit element having a smaller variation than the tuning-targeted circuit element; a comparator configured to obtain a difference between values (or intensities) of predetermined first and second signals detected from the test circuit unit; and a tuning unit configured to tune the variation of the tuning-targeted circuit element according to the difference between the values of the predetermined first and second signals.

The test circuit unit may include: a first voltage divider including first and second test circuit elements of the plurality of test circuit elements connected to each other in series; and a second voltage divider including a third test circuit element of the plurality of test circuit elements and the at least one reference circuit element connected to each other in series. Voltages having an identical value may be applied to the first and second voltage dividers.

The first signal may be detected at a connection point between the first and second test circuit elements, and the second signal may be detected at a connection point between the third test circuit element and the at least one reference circuit element.

The comparator may output a digital control signal corresponding to the difference between the values of the first and second signals.

The tuning unit may include: a plurality of switches selectively turned on and/or off according to the digital control signal output corresponding to the difference between the values of predetermined first and second signal from the comparator; and a plurality of tuning circuit elements connected to the tuning-targeted circuit element in series or in parallel depending on whether the plurality of switches are turned on and/or off, to tune the variation of the tuning-targeted circuit element.

According to another aspect of the present invention, there is provided a method of tuning a variation of an IC comprising a plurality of circuit elements, including: operating a test circuit unit including a plurality of test circuit elements having identical element values and variations to a tuning-targeted circuit element of the plurality of circuit elements and at least one reference circuit element having a smaller variation than the tuning-targeted circuit element, so as to detect first and second signals; outputting a digital signal corresponding to a difference between values of the first and second signals; and tuning a variation of the tuning-targeted circuit element according to the digital control signal.

The test circuit unit may include: a first voltage divider including first and second test circuit elements of the plurality of test circuit elements connected to each other in series; and a second voltage divider including a third test circuit element of the plurality of test circuit elements and the at least one reference circuit element connected to each other in series. Voltages having an identical intensity may be applied to the first and second voltage dividers.

The first signal may be detected at a connection point between the first and second test circuit elements, and the second signal may be detected at a connection point between the third test circuit element and the at least one reference circuit element.

The tuning of the variation of the tuning-targeted circuit element according to the digital control signal may include: selectively turning on and/or off a plurality of switches according to the digital control signal output from the comparator; and connecting a plurality of tuning circuit elements to the tuning-targeted circuit element in series or in parallel depending on whether the plurality of switches are turned on and/or off, to tune the variation of the tuning-targeted circuit element.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF EXEMPLARY EMBODIMENTS

Figure 1:
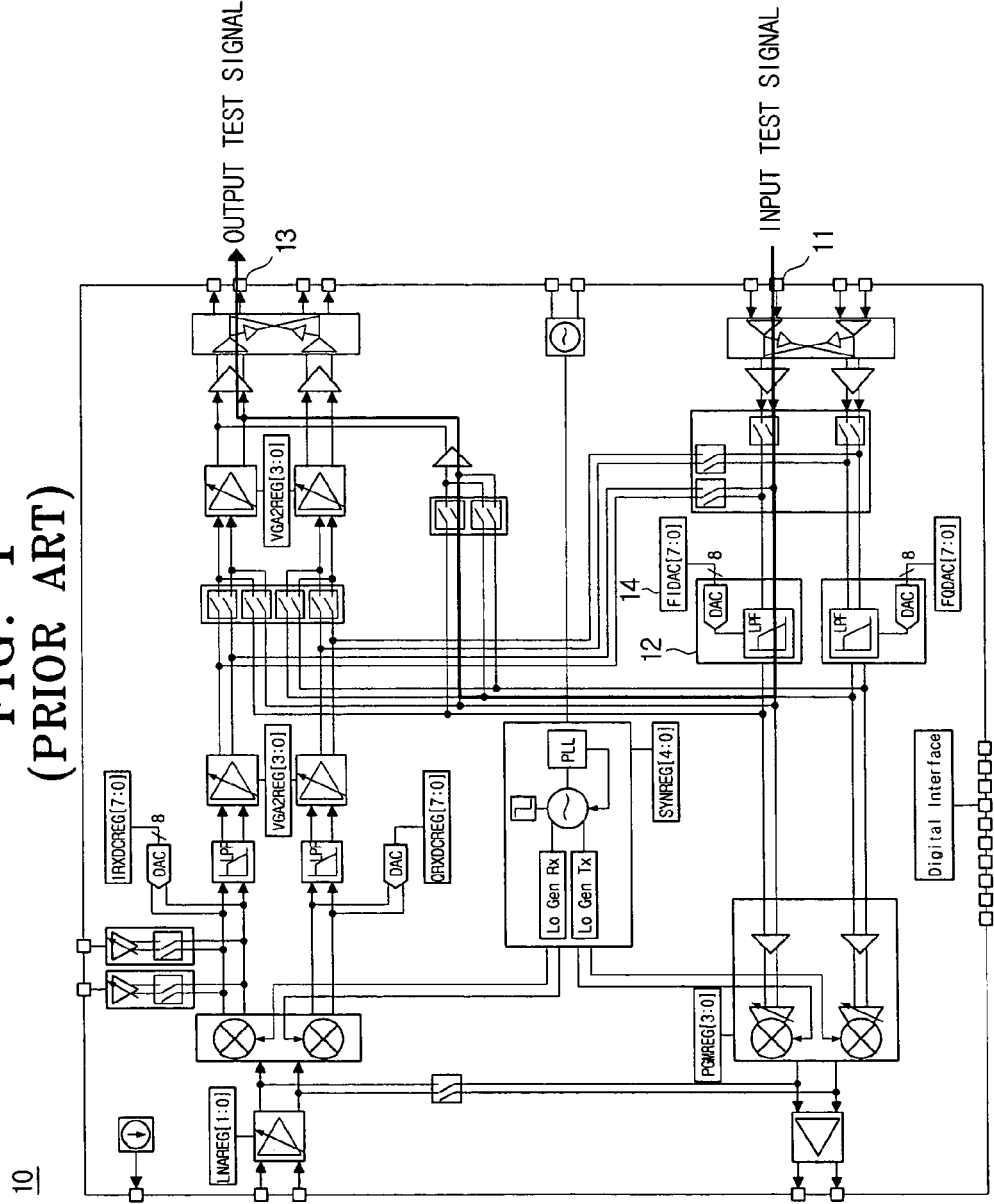
FIG. 1 is a circuit diagram illustrating a conventional method of tuning a process variation.

Exemplary embodiments of the present invention will be described in greater detail with reference to the accompanying drawings.

In the following description, same drawing reference numerals are used for the same elements even in different drawings. Descriptions of non-limiting exemplary embodiments of the present invention are to assist in a comprehensive understanding of the invention. However, it is apparent that the present invention is not bounded by the particular elements defined in the description. Also, well-known functions or constructions are not described in detail since they would obscure the invention in unnecessary detail.

Figure 2:
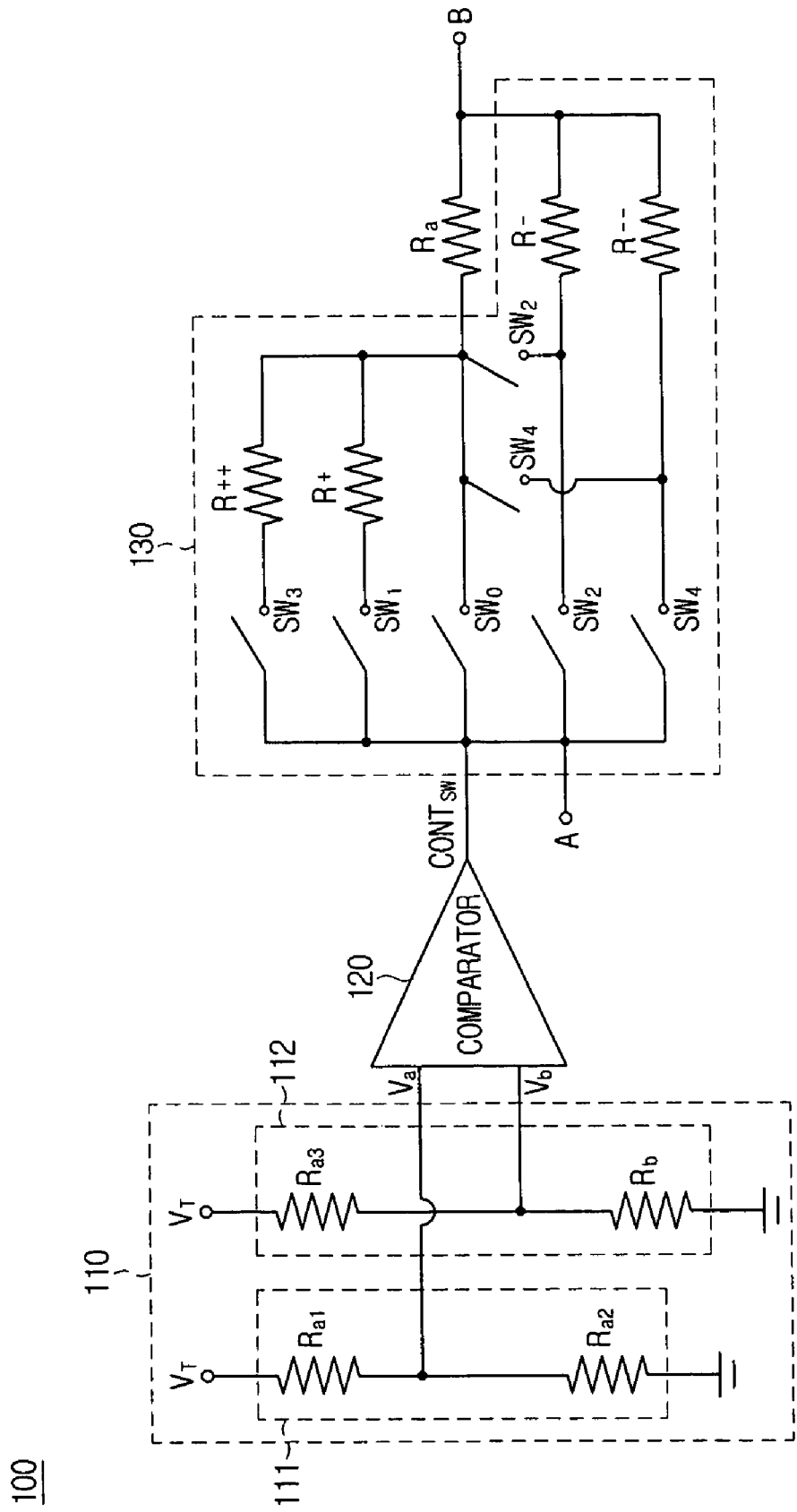
FIG. 2 is a circuit diagram of a tuning circuit unit of an IC according to an exemplary embodiment of the present invention.

FIG. 2 is a circuit diagram of a tuning circuit unit of an IC according to an exemplary embodiment of the present invention. A tuning circuit unit 100 shown in FIG. 2 may be included in various types of ICs (not shown). Referring to FIG. 2, a resistor element marked with reference character "Ra" is a circuit element of an IC, i.e., a circuit element (hereinafter referred to as a "tuning-targeted resistor element") of the tuning circuit unit 100 to be tuned.

The tuning-targeted resistor element $R_a$ may have element values and errors (hereinafter referred to as "process variations") from the manufacturer of the IC due to an error in a manufacturing process and may have element values (hereinafter referred to as "temperature variations") varying with heat generated during the operation of the IC. The tuning circuit unit 100 according to the present exemplary embodiment tunes the process and temperature variations of the tuning-targeted resistor element $R_a$.

When power is applied to the IC and the IC is initialized, the tuning circuit unit 100 according to the present embodiment operates to tune the process variations of the tuning-targeted resistor elements $R_a$. Also, the tuning circuit unit 100 continuously operates during the operation of the IC to tune the temperature variations of the tuning-targeted resistor element $R_a$.

Referring to FIG. 2, the tuning circuit unit 100 according to the present exemplary embodiment includes a test circuit unit 110, a comparator 120, and a tuning unit 130.

The test circuit unit 110 includes a plurality of test resistor elements $R_{a1}$, $R_{a2}$, and $R_{a3}$ and a reference resistor element $R_b$. The test resistor elements $R_{a1}$, $R_{a2}$, and $R_{a3}$ are manufactured in the IC using the same process by which the tuning-targeted resistor element $R_a$ is manufactured, so as to have the same resistance values and variations as the tuning-targeted resistor element $R_a$.

The reference resistor element $R_b$ is less or hardly affected by the process and temperature variations than the tuning-targeted resistor $R_a$. Also, the reference resistor element $R_b$ may be manufactured to have the same resistor value the manufacturer desires to have with respect the tuning-targeted resistor element $R_a$.

The test circuit unit 110 may be divided into a first voltage divider 111 including the first and second test resistor elements $R_{a1}$ and $R_{a2}$ and a second voltage divider 112 including the third test resistor element $R_{a3}$ and the reference resistor element $R_b$. A test voltage $V_T$ is equally applied to the first and second voltage dividers 111 and 112 during the operation of the tuning circuit unit 100.

The first and second test resistor elements $R_{a1}$ and $R_{a2}$ have the same element values and variations. Thus, a value of a first voltage signal $V_a$ output at a connection point between the first and second test circuit elements $R_{a1}$ and $R_{a2}$ is $0.5V_T$ and does not vary.

A value of a second voltage signal $V_b$ output at a connection point between the third test circuit element $R_{a3}$ and the reference resistor element $R_b$ varies with a variation of the third test circuit element $R_{a3}$.

For example, the first, second, and third test resistor elements $R_{a1}$, $R_{a2}$, and $R_{a3}$ are manufactured to have element values of 2 kΩ but may substantially have element values of 2.02 kΩ due to the process or temperature variation. In this case, the second voltage signal $V_b$ is smaller than the first voltage signal $V_a$. If the first, second, and third test resistor elements $R_{a1}$, $R_{a2}$, and $R_{a3}$ substantially have element values of 1.98 kΩ due to the process or temperature distribution, the second voltage signal $V_b$ is larger than the first voltage signal $V_a$. If the first, second, and third test resistor elements $R_{a1}$, $R_{a2}$, and $R_{a3}$ hardly vary, the second voltage signal $V_b$ is equal to the first voltage signal $V_a$.

Thus, values of the first and second voltage signals $V_a$ and $V_b$ output by dividing the test voltage $V_T$ through the first and second voltage dividers 111 and 112 can be compared so as to measure the variation of the tuning-targeted resistor element $R_a$.

The comparator 120 receives the first and second voltage signals $V_a$ and $V_b$ from the test circuit unit 110 and compares the first and second voltage signals $V_a$ and $V_b$ to output a digital control signal CONTsw corresponding to a difference between the first and second voltage signals $V_a$ and $V_b$. For example, the comparator 120 may divide a difference between values of analog voltage signals $V_a$ and $V_b$ into predetermined steps and then output the digital control signal CONTsw corresponding to each of the steps.

The tuning unit 130 includes a plurality of switches $SW_0$, $SW_1$, $SW_2$, $SW_3$, and $SW_4$ and a plurality of tuning resistor elements R++, R+, R−, and R−−.

The plurality of switches $SW_0$, $SW_1$, $SW_2$, $SW_3$, and $SW_4$ are selectively turned on and/or off according to the digital control signal CONTsw output from the comparator 120 so as to connect the plurality of tuning resistor elements R++, R+, R−, and R−− to the tuning-targeted resistor element Ra in series and parallel.

The plurality of tuning resistor elements R++, R+, R−, and R−− may be connected to the tuning-targeted resistor element $R_a$ in series and parallel depending on whether the plurality of switches $SW_0$, $SW_1$, $SW_2$, $SW_3$, and $SW_4$ are selectively turned on and/or off, so as to tune the variation of the tuning-targeted resistor element $R_a$.

The plurality of tuning resistor elements R++, R+, R−, and R−− may be connected to the tuning-targeted resistor element $R_a$ in series and parallel between connection points A and B at which the tuning-targeted resistor element $R_a$ is connected to other circuit elements of the IC, to increase a resistance value between the connection points A and B so as to tune the variation of the tuning-targeted resistor element $R_a$.

For example, if R++>R+ and R−>R−−, the resistance value between the connection points A and B is increased in order of turning on switches $SW_0$, $SW_1$, $SW_2$, $SW_3$, and $SW_4$. In other words, if the switch $SW_3$ is turned on, the tuning resistor element R++ is connected to the tuning-targeted resistor element $R_a$ in series so as to increase the resistance value between the connection points A and B. If the switch $SW_4$ is turned on, the tuning resistor element R−− is connected to the tuning-targeted resistor element $R_1$ in parallel to decrease the resistance value between the connection points A and B to the smallest value.

Figure 3:
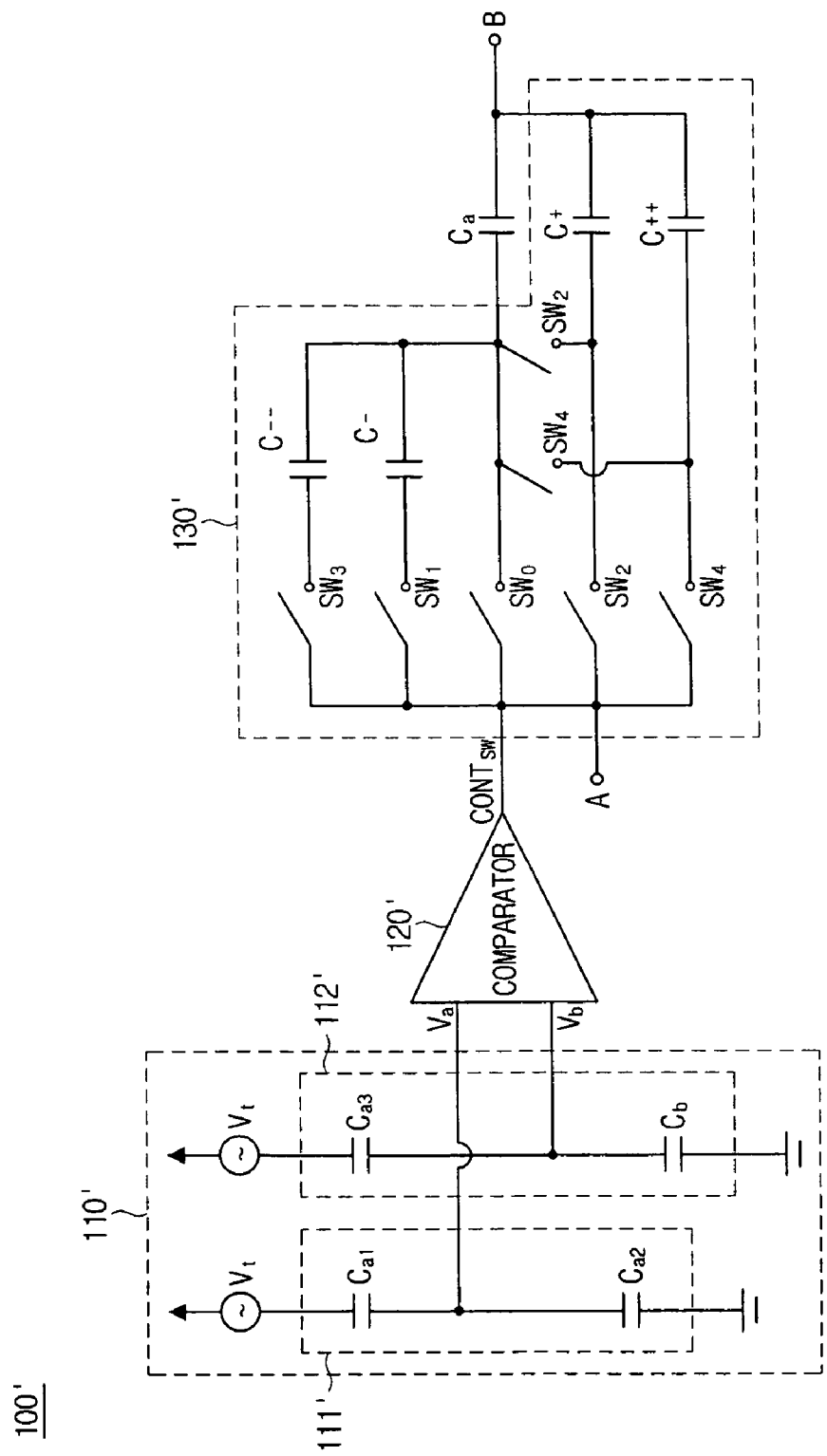
FIG. 3 is a circuit diagram of a tuning circuit unit according to another exemplary embodiment of the present invention.

FIG. 3 is a circuit diagram of a tuning circuit unit according to another exemplary embodiment of the present invention. Referring to FIG. 3, a tuning circuit unit 100' includes a test circuit unit 110', a comparator 120', and a tuning unit 130'. A capacitor marked with reference character "$C_a$" is a circuit element of an IC, i.e., a circuit element (hereinafter referred to as a "tuning-targeted capacitor") of the tuning circuit unit 100' to be tuned according to the present exemplary embodiment.

The test circuit unit 110' includes a plurality of capacitors $C_{a1}$, $C_{a2}$, and $C_{a3}$ and a reference capacitor $C_b$. The plurality of capacitors $C_{a1}$, $C_{a2}$, and $C_{a3}$ are manufactured in the IC using the same method by which the tuning-targeted capacitor $C_a$ is manufactured to have the same element values and variations as the tuning-targeted capacitor $C_a$.

The reference capacitor $C_b$ may be a metal-oxide semiconductor (MOS) capacitor or a chip capacitor that is less or hardly affected by process and temperature variations than the tuning-targeted capacitor $C_a$ and have a capacitance value a manufacturer desires to have with respect to the tuning-targeted capacitor $C_a$.

The test circuit unit 110' may be classified into a first voltage divider 111' including the first and second test capacitors $C_{a1}$ and $C_{a2}$ and a second voltage divider 112' including the reference capacitor $C_b$. A test voltage $V_t$ is equally applied to the first and second voltage dividers 111' and 112' during the operation of the tuning circuit unit 100'. The first and second voltage dividers 111' and 112' include capacitors. Thus, the test voltage $V_t$ may be applied to the first and second voltage dividers 111' and 112'.

A value of a first voltage signal $V_a$ output from a connection point between the first and second test capacitors $C_{a1}$ and $C_{a2}$ is $0.5V_t$ and does not vary. A value of a second voltage $V_b$ output from a connection point between the third test capacitor $C_{a3}$ and the reference capacitor $C_b$ varies with a variation of the third test capacitor $C_{a3}$.

If the second voltage signal $V_b$ is larger than the first voltage signal $V_a$ in the previous exemplary embodiment described with reference to FIG. 2, the resistance value of the third test resistor element $R_{a3}$ is smaller than the resistance value of the reference resistor element $R_b$. However, in the present exemplary embodiment described with reference to FIG. 3, a capacitance value of the third test capacitor $C_{a3}$ is larger than a capacitance value of the reference capacitor $C_b$.

The comparator 120' may receive the first and second voltage signals $V_a$ and $V_b$ from the test circuit unit 110', compare the first and second voltage signals $V_a$ and $V_b$, classify a difference between values of the first and second voltage signals $V_a$ and $V_b$ into predetermined steps and output a digital control signal CONTsw corresponding to each of the steps. In the present exemplary embodiment, the first and second voltage signals $V_a$ and $V_b$ are alternating signals. Thus, peak voltage values of the first and second voltage signals $V_a$ and $V_b$ detected by a peak detector (not shown) may be input to the comparator 120'.

The tuning unit 130' includes a plurality of switches $SW_0$, $SW_1$, $SW_2$, $SW_3$, and $SW_4$ and a plurality of tuning capacitors C++, C+, C−, and C−−.

The plurality of switches $SW_0$, $SW_1$, $SW_2$, $SW_3$, and $SW_4$ are selectively turned on and/or off according to the digital control signal CONTsw output from the comparator 120' so as to connect the plurality of tuning capacitors C++, C+, C−, and C−− to the tuning-targeted capacitor $C_a$ in series and parallel.

The plurality of tuning capacitors C++, C+, C−, and C−− are connected to the tuning-targeted capacitor $C_a$ in series and parallel depending on whether the plurality of switches $SW_0$, $SW_1$, $SW_2$, $SW_3$, and $SW_4$ are selectively turned on and/off, so as to tune a variation of the tuning-targeted capacitor $C_a$.

For example, the plurality of tuning capacitors C++, C+, C−, and C−− are connected to the tuning-targeted Capacitor $C_a$ in series and parallel between connection points A and B at which the tuning-targeted capacitor $C_a$ is connected to other circuit elements of the IC, to increase a capacitance value between the connection points A and B so as to tune the variation of the tuning-targeted capacitor $C_a$.

If C++>C+ and C−>C−−, the capacitance value between the connection points A and B is decreased in order of turning on switches $SW_0$, $SW_1$, $SW_2$, $SW_3$, and $SW_4$. In other words, if the switch $SW_3$ is turned on, the tuning capacitor C−− is connected to the tuning-targeted capacitor $C_a$ in series so as to decrease the capacitance value between the connection points A and B to the smallest value. If the switch $SW_4$ is turned on, the tuning capacitor C++ is connected to the tuning-targeted capacitor $C_a$ in parallel so as to increase the capacitance value between the connection points A and B to the largest value.

In the exemplary embodiments described with reference to FIGS. 2 and 3, the tuning units 110 and 110' divide variations of tuning-targeted circuit elements into five steps to tune the variations. The tuning units 110 and 110' are not limited to the previously illustrated configurations. The tuning units may be constituted using many more switches and tuning circuit elements to further accurately tune the variations. Also, the tuning-targeted circuit elements are not limited to only resistors and capacitors but not limited to this.

Figure 4:
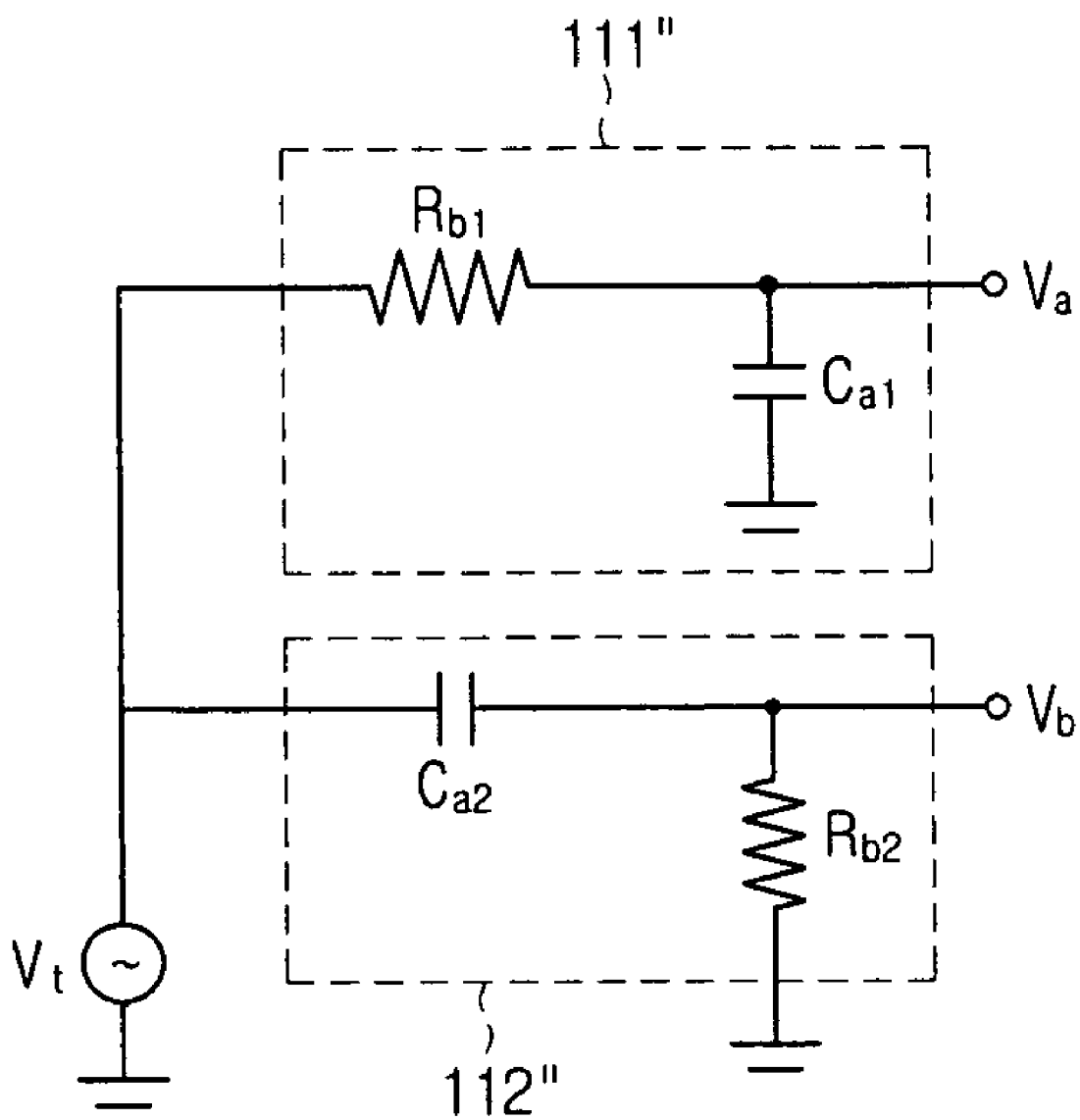
FIG. 4 is a circuit diagram of a test circuit unit shown in FIG. 3 according to another exemplary embodiment of the present invention.

FIG. 4 is a circuit diagram of a test circuit unit shown in FIG. 3 according to another exemplary embodiment of the present invention. Referring to FIG. 4, a test circuit unit 110" may include first and second test capacitors $C_{a1}$ and $C_{a2}$ and first and second reference resistor elements $R_{b1}$ and $R_{b2}$. The first capacitor $C_{a1}$ and the first reference resistor element $R_{b1}$ constitute a LPF 111", and the second test capacitor $C_{a2}$ and the second reference resistor element $R_{b2}$ constitute a high pass filter (HPF) 112".

In the present exemplary embodiment, where a capacitance value of a capacitance varies, a variation of a tuning-targeted circuit element is measured using variations in cut-off frequencies of a LPF and a HPF.

If the first and second test capacitors $C_{a1}$ and $C_{a2}$ do not have variations, a voltage $V_t$ has a frequency corresponding to the cut-off frequencies of the LPF 111" and the HPF 112" and is commonly applied to the LPF 111" and the HPF 112" without a variation in the frequency.

If the first and second test capacitors $C_{a1}$ and $C_{a2}$ (tuning-targeted capacitors) do not have variations, values of voltage signals output from the HPF 112" and the LPF 111" are the same.

If the capacitance value of the tuning-targeted capacitor $C_a$ is larger than a desired value depending on process and temperature variations, the cut-off frequencies of the LPF 111" and the HPF 112" are lower than when the process and temperature variations do not occur. Thus, the value of the voltage signal output from the HPF 112" is larger than the value of the voltage signal output from the LPF 111".

If the capacitance value of the tuning-targeted capacitor $C_a$ is smaller than the desired value depending on the process and temperature variations, the value of the voltage signal output from the HPF 112" is smaller than the value of the voltage signal output from the LPF 111".

Accordingly, the comparator 120' outputs a digital control signal CONTsw corresponding to a difference between values of voltage signals $V_a$ and $V_b$ output from the HPF 112" and the LPF 111" to the tuning unit 130' as in the previous exemplary embodiment described with reference to FIG. 3. Thus, the tuning unit 130' connects the tuning capacitors C++, C+, C−, and C−− to the tuning-targeted capacitor $C_a$ in series and parallel according to digital control signal CONTsw so as to tune the process and temperature variations.

Figure 5:
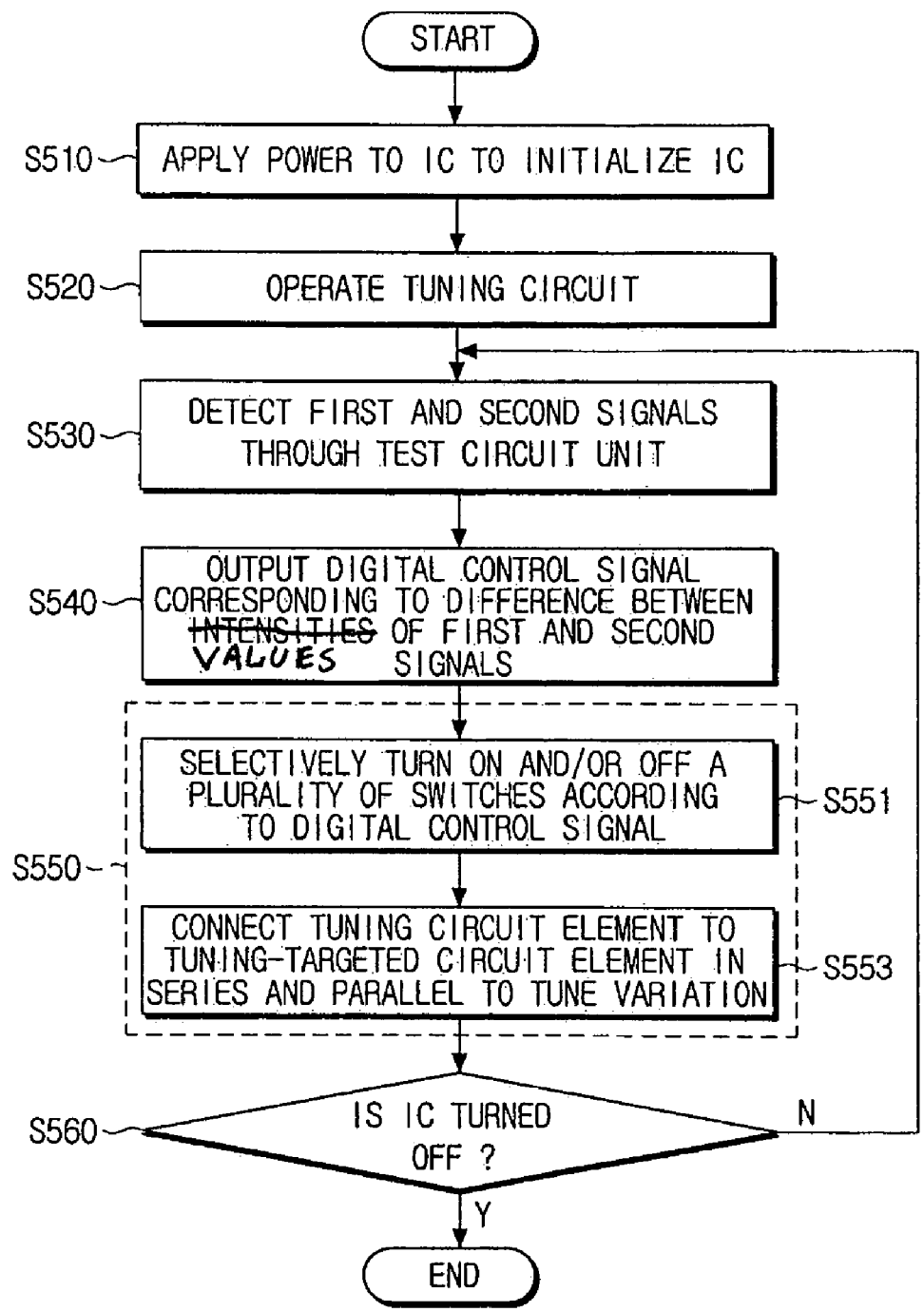
FIG. 5 is a flowchart of a variation tuning method performed by a tuning circuit unit shown in FIG. 2 according to an exemplary embodiment of the present invention.

FIG. 5 is a flowchart of a variation tuning method performed by a tuning circuit unit shown in FIG. 2 according to an exemplary embodiment of the present invention. Referring to FIGS. 2 and 5, in operation S510, a power is applied to an IC (not shown) to initialize the IC. In operation S520, the tuning circuit unit 100 starts an operation thereof to tune a process variation.

The voltage $V_t$ is applied to the first and second voltage dividers 111 and 112 and then divided. In operation S530, the first voltage signal $V_a$ is detected at the connection point between the first and second test resistor elements $R_{a1}$ and $R_{a2}$, the second voltage signal $V_b$ is detected between the connection point between the third test resistor element $R_{a3}$ and the reference resistor element $R_b$, and the first and second voltage signals $V_a$ and $V_b$ are input to the comparator 120.

In operation S540, the comparator 120 compares the values of the first and second voltage signals $V_a$ and $V_b$ to output the digital control signal CONTsw corresponding to the difference between the values of the first and second voltage signals $V_a$ and $V_b$.

In operation S550, the tuning unit 130 tunes the process variation of the tuning-targeted resistor element $R_a$ according to the digital control signal CONTsw output from the comparator 120.

Particularly, in operation S551, the tuning unit 130 selectively turns on and/or off the plurality of switches SW$_0$, SW$_1$, SW$_2$, SW$_3$, and SW$_4$ according to the digital control signal CONTsw output from the comparator 120. In operation S553, the tuning unit 130 connects the tuning circuit elements R++, R+, R−, and R−− to the tuning-targeted resistor element $R_a$ in series and parallel to increase the resistance value between the connection points A and B so as to tune the process variation of the tuning-targeted resistor element $R_a$.

If the power is applied to the IC, the tuning circuit unit 100 according to the present invention performs operations S520 through 550 to tune the process variation of the tuning-targeted resistor element $R_a$. The tuning circuit unit 100 repeats operation S530 through 550 until the IC is turned off in operation S560 so as to tune the temperature variation of the tuning-targeted resistor element $R_a$ occurring during the operation of the IC.

As described above, according to the present invention, process and temperature variations of a circuit element can be detected with respect to the circuit element itself. Thus, the process and temperature variations can be accurately tuned.

Also, the process and temperature variations can be tuned inside an IC. Thus, the time required for tuning the process and temperature variations is reduced. A mode is not required to communicate with an external tuning circuit. As a result, the IC can be simply realized.

In addition, the temperature variation of the circuit element occurring due to heat during the operation of the IC is taken into account for accurate operation of the IC.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An integrated circuit (IC) comprising a plurality of circuit elements, comprising:
    a test circuit unit comprising a plurality of test circuit elements having element values and variations identical to a tuning-targeted circuit element of the plurality of circuit elements and at least one reference circuit element having a smaller variation than the tuning-targeted circuit element;
    a comparator configured to obtain a difference between values of a first signal and a second signal detected from the test circuit unit to measure the variation of the tuning-targeted circuit element; and
    a tuning unit configured to tune the variation of only the tuning-targeted circuit element according to the difference between a value of the first signal and a value of the second signal,
    wherein the test circuit unit further comprises:
    a first voltage divider comprising first and second test circuit elements, of the plurality of test circuit elements, connected to each other in series; and
    a second voltage divider comprising a third test circuit element, of the plurality of test circuit elements, and the at least one reference circuit element,
    wherein the third test circuit element is connected to the at least one reference circuit element in series, and
    wherein voltages having an identical value are applied to the first and second voltage dividers.

2. The IC of claim 1, wherein the first signal is detected at a connection point between the first and second test circuit elements, and the second signal is detected at a connection point between the third test circuit element and the at least one reference circuit element.

3. The IC of claim 1, wherein the comparator outputs a digital control signal corresponding to the difference between the value of the first signal and the value of the second signal.

4. The IC of claim 3, wherein the tuning unit further comprises:
    a plurality of switches selectively turned on and off, respectively, according to the digital control signal output corresponding to the difference between the value of the first signal and the value of the second signal from the comparator; and a plurality of tuning circuit elements connected to the tuning-targeted circuit element in series or in parallel, depending on whether the plurality of switches are respectively turned on and off, to tune the variation of the tuning-targeted circuit element.

5. A method of tuning a variation of an IC comprising a plurality of circuit elements, comprising:
   operating a test circuit unit comprising a plurality of test circuit elements having element values and variations identical to a tuning-targeted circuit element of the plurality of circuit elements and at least one reference circuit element having a smaller variation than the tuning-targeted circuit element, so as to detect a first signal and a second signal from the test circuit unit;
   outputting a digital signal corresponding to a difference between a value of the first signal and a value of the second signal to measure the variation of the tuning-targeted circuit element; and
   tuning a variation of only the tuning-targeted circuit element according to the digital control signal,
   wherein the test circuit unit further comprises:
   a first voltage divider comprising first and second test circuit elements, of the plurality of test circuit elements, connected to each other in series; and
   a second voltage divider comprising a third test circuit element, of the plurality of test circuit elements, and the at least one reference circuit element,
   wherein the third test circuit element is connected to the at least one reference circuit element in series,
   wherein voltages having an identical value are applied to the first and second voltage dividers.

6. The method of claim 5, wherein the first signal is detected at a connection point between the first and second test circuit elements, and the second signal is detected at a connection point between the third test circuit element and the at least one reference circuit element.

7. The method of claim 6, wherein the tuning the variation of the tuning-targeted circuit element according to the digital control signal comprises:
   selectively turning on and off a plurality of switches, respectively, according to the digital control signal output from the comparator; and
   connecting a plurality of tuning circuit elements to the tuning-targeted circuit element in series or in parallel, depending on whether the plurality of switches are respectively turned on and off, to tune the variation of the tuning-targeted circuit element.

* * * * *